(12) United States Patent
Kang et al.

(10) Patent No.: US 8,569,614 B2
(45) Date of Patent: Oct. 29, 2013

(54) SOLAR CELL AND METHOD OF MANUFACTURING THE SAME

(75) Inventors: Juwan Kang, Seoul (KR); Jihoon Ko, Seoul (KR); Juhwan Yun, Seoul (KR); Jonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 117 days.

(21) Appl. No.: 12/649,039

(22) Filed: Dec. 29, 2009

(65) Prior Publication Data

US 2010/0218818 A1    Sep. 2, 2010

(30) Foreign Application Priority Data

Mar. 2, 2009 (KR) .................. 10-2009-0017737

(51) Int. Cl.
*H01L 31/0236* (2006.01)

(52) U.S. Cl.
USPC ........................................... 136/256

(58) Field of Classification Search
USPC .................................. 136/243–265
See application file for complete search history.

(56) References Cited

U.S. PATENT DOCUMENTS

| | | | |
|---|---|---|---|
| 6,384,317 B1 * | 5/2002 | Kerschaver et al. | 136/256 |
| 2002/0153039 A1 | 10/2002 | Moon et al. | |
| 2003/0102022 A1 * | 6/2003 | Fath et al. | 136/256 |
| 2004/0112426 A1 | 6/2004 | Hagino | |
| 2004/0261839 A1 | 12/2004 | Gee et al. | |
| 2007/0186971 A1 | 8/2007 | Lochun et al. | |
| 2009/0139570 A1 * | 6/2009 | Kinoshita | 136/256 |
| 2009/0211628 A1 * | 8/2009 | Engelhart et al. | 136/256 |
| 2010/0275987 A1 | 11/2010 | Sakamoto et al. | |

FOREIGN PATENT DOCUMENTS

| | | |
|---|---|---|
| CN | 1813356 A | 8/2006 |
| DE | 197 44 197 A1 | 7/1998 |
| EP | 1 953 828 A1 | 8/2008 |
| EP | 2 068 369 A1 | 6/2009 |
| EP | 2 104 147 A1 | 9/2009 |
| JP | 61-292379 A | 12/1986 |
| JP | 64-82570 A | 3/1989 |
| JP | 8-181342 A | 7/1996 |
| WO | WO/2006/111304 | * 10/2006 |
| WO | 2008/078771 A1 | 7/2008 |

OTHER PUBLICATIONS

Schonecker et al., "An Industrial Multi-Crystalline EWT Solar Cell With Screen Printed Metallisation", 14th European PVSEC, Energy Research Foundation ENC, pp. 796-799, 1997.

* cited by examiner

*Primary Examiner* — Jonathan Johnson
*Assistant Examiner* — Christina Chern
(74) *Attorney, Agent, or Firm* — Birch, Stewart, Kolasch & Birch, LLP

(57) ABSTRACT

A solar cell and a method of manufacturing the same are disclosed. The solar cell includes a substrate of a first conductive type having at least one via hole, an emitter layer of a second conductive type opposite the first conductive type formed in the substrate, at least one first electrode formed on the emitter layer, at least one current collector positioned opposite the at least one first electrode with the substrate interposed between the at least one first electrode and the at least one current collector and is electrically connected to the at least one first electrode through the at least one via hole, and a second electrode that is spaced apart from the at least one current collector and is electrically connected to the substrate. A plurality of uneven portions are formed in the at least one via hole.

9 Claims, 9 Drawing Sheets

SOLAR CELL AND METHOD OF MANUFACTURING THE SAME

This application claims priority to and the benefit of Korean Patent Application No. 10-2009-0017737 filed in the Korean Intellectual Property Office on Mar. 2, 2009, the entire contents of which are incorporated herein by reference.

BACKGROUND OF THE INVENTION

1. Field of the Invention

Embodiments of the invention relate to a solar cell and a method of manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

At least one current collector is positioned on each of the emitter layer and the substrate, and the current collector on the emitter layer is connected to the electrode electrically connected to the emitter layer and the current collector on the substrate is connected to the electrode electrically connected to the substrate. Thus, the electrons and the holes collected by the corresponding electrodes of the emitter layer and the substrate move to a load connected to the outside through the corresponding current collectors.

However, in this case, because the current collectors are formed on the emitter layer on an incident surface of the substrate, on which light is incident, as well as a non-incident surface of the substrate, on which light is not incident, an incident area of light decreases. Hence, efficiency of the solar cell is reduced.

Accordingly, a metal wrap through (MWT) solar cell and a back contact solar cell were developed so as to prevent a reduction in the efficiency of the solar cell resulting from the current collectors. In the MWT solar cell, a current collector connected to an emitter layer is formed on a rear surface of a substrate opposite a light incident surface of the substrate. In the back contact solar cell, all of electrodes collecting electrons and holes are formed on a rear surface of a substrate.

SUMMARY OF THE INVENTION

In one aspect, there is a solar cell including a substrate of a first conductive type having at least one via hole, a plurality of uneven portions being formed in the at least one via hole, an emitter layer of a second conductive type opposite the first conductive type formed in the substrate, at least one first electrode formed on the emitter layer, at least one current collector electrically connected to the at least one first electrode through the at least one via hole, the at least one first electrode and the at least one first electrode being on opposite surfaces of the substrate; and a second electrode that is spaced apart from the at least one current collector and is electrically connected to the substrate.

A plurality of uneven portions may be formed on at least one of a front surface and a rear surface of the substrate.

A height of each of the plurality of uneven portions formed in the at least one via hole may be different from a height of each of the plurality of uneven portions formed on the at least one surface of the substrate. The height of each of the plurality of uneven portions formed in the at least one via hole may be greater than the height of each of the plurality of uneven portions formed on the at least one surface of the substrate. The height of each of the plurality of uneven portions formed on the at least one surface of the substrate may be approximately 5 μm to 10 μm, and the height of each of the plurality of uneven portions formed in the at least one via hole may be approximately 10 μm to 50 μm.

A diameter of the at least one via hole formed at a light incident surface of the substrate may be smaller than a diameter of the at least one via hole formed at a surface of the substrate opposite the light incident surface.

The at least one via hole may have an increasing diameter as it goes from a light incident surface of the substrate to a surface of the substrate opposite the light incident surface.

A ratio of a maximum width to a minimum width of the at least one via hole may be approximately 1:0.1 to 1:0.9.

The solar cell may further include an anti-reflection layer formed on the emitter layer that is formed on a front surface of the substrate.

The solar cell may further include a back surface field layer of the first conductive type formed between the second electrode and the substrate, the back surface field layer having an impurity doping concentration greater than an impurity doping concentration of the substrate.

In another aspect, there is a method of manufacturing a solar cell including forming at least one via hole in a substrate of a first conductive type, texturing a surface of the substrate inside the at least one via hole to form a plurality of uneven portions on the surface of the substrate inside the at least one via hole, forming an emitter layer on the substrate, and forming a front electrode electrically connected to the emitter layer, a current collector electrically connected to the front electrode through the at least one via hole, and a rear electrode that is spaced apart from the current collector and is electrically connected to the substrate.

The method may include removing a damaged portion of the at least one via hole when the plurality of uneven portions are formed on the surface of the substrate inside the at least one via hole.

The method may include forming a plurality of uneven portions on a front surface and a rear surface of the substrate when the plurality of uneven portions are formed on the surface of the substrate inside the at least one via hole.

The method may include generating an ultrasonic vibration in an etchant to perform etching on a portion of each of the front surface and the rear surface of the substrate where the at least one via hole is not formed, and on the surface of the substrate inside the at least one via hole.

A diameter of the at least one via hole formed at the front surface of the substrate may be different from a diameter of the at least one via hole formed at the rear surface of the substrate opposite the front surface.

The forming of the front electrode, the current collector, and the rear electrode may include applying a first paste containing a first conductive material at the at least one via hole in the rear surface of the substrate and on the emitter layer around the at least one via hole at the rear surface of the substrate, applying a second paste containing a second conductive material on the first paste exposed through the at least one via hole at the front surface of the substrate and on the substrate around the at least one via hole at the front surface of the substrate, applying a third paste containing a third conductive material on the rear surface of the substrate, so that the third paste is spaced apart from the first paste, and performing a thermal process on the substrate, on which the first to third pastes are applied, to form the current collector from the first paste, to form the front electrode from the second paste, and to form the rear electrode from the third paste.

The forming of the at least one via hole may use a laser drilling method. A diameter of the at least one via hole formed at a light incident surface of the substrate, on which a laser beam is incident, may be smaller than a diameter of the at least one via hole formed in a surface of the substrate opposite the light incident surface.

The method may further include removing portions of the emitter layer formed at an edge of the substrate and formed between the rear electrode and the current collector.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
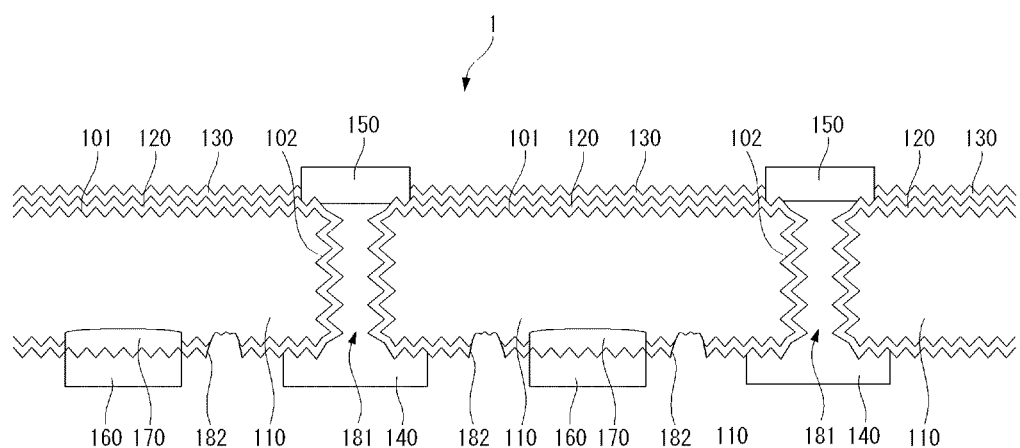
FIG. 1 is a partial cross-sectional view of a solar cell according to an embodiment of the invention.

The invention will be described more fully hereinafter with reference to the accompanying drawings, in which example embodiments of the inventions are shown. This invention may, however, be embodied in many different forms and should not be construed as only limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Reference will now be made in detail to embodiments of the invention, examples of which are illustrated in the accompanying drawings.

A solar cell according to an embodiment of the invention is described below in detail with reference to FIGS. 1, 2A, and 2B.

Figure 2A:
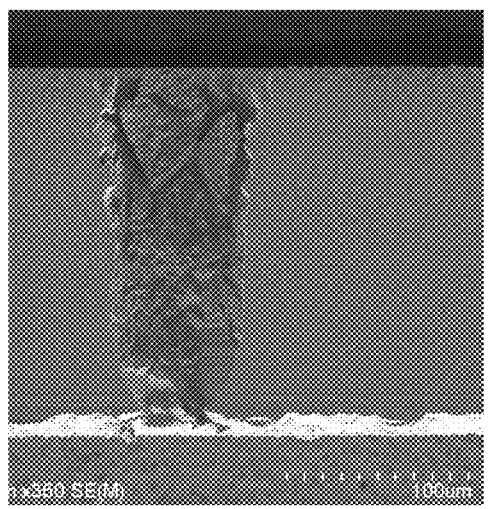
FIGS. 2A and 2B are a cross-sectional view and a partial enlarged view of a via hole, respectively.
Figure 2B:
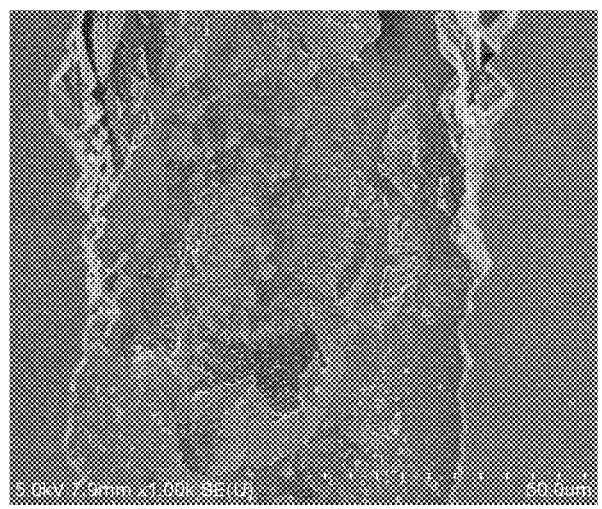

FIG. 1 is a partial cross-sectional view of a solar cell according to an embodiment of the invention. FIGS. 2A and 2B are a cross-sectional view and a partial enlarged view of a via hole, respectively.

As shown in FIG. 1, a solar cell 1 according to an embodiment of the invention includes a substrate 110 having a plurality of via holes 181, an emitter layer 120 on the substrate 110, an anti-reflection layer 130 on the emitter layer 120 formed on an incident surface (hereinafter, referred to as "a front surface") of the substrate 110 on which light is incident, a plurality of first electrodes 150 (hereinafter, referred to as "a plurality of front electrodes") formed on the emitter layer 120 on the front surface of the substrate 110, at least one current collector 140 that is formed in at least a portion of each via hole 181 on a surface (hereinafter, referred to as "a rear surface") of the substrate 110 opposite the incident surface of the substrate 110, a second electrode 160 (hereinafter, referred to as "a rear electrode") that is formed on the rear surface of the substrate 110 to be spaced apart from the at least one current collector 140, and a back surface field (BSF) layer 170 between the rear electrode 160 and the substrate 110 underlying the rear electrode 160.

In the embodiment, the substrate 110 is a semiconductor substrate formed of first conductive type silicon, for example, p-type silicon, though not required. Examples of silicon include single crystal silicon, polycrystalline silicon, and amorphous silicon. When the substrate 110 is of a p-type, the substrate 110 contains impurities of a group III element such as boron (B), gallium (Ga), and indium (In). Alternatively, the substrate 110 may be of an n-type, and/or be formed of materials other than silicon. If the substrate 110 is of the n-type, the substrate 110 may contain impurities of a group V element such as phosphor (P), arsenic (As), and antimony (Sb).

The substrate 110 has the plurality of via holes 181, each of which passes through the substrate 110. Further, the surface of the substrate 110 is textured to form a textured surface corresponding to an uneven surface or having uneven characteristics. The textured surface has a plurality of uneven portions 101 and 102.

In the embodiment, a textured state of the substrate 110 varies depending on a location of the substrate 110. For example, a textured state of the textured surface of the substrate 110 inside each of the via holes 181 is different from a textured state of the textured surface of the substrate 110 in which the via holes 181 are not formed. In the embodiment, the textured surface of the substrate 110 in formation portions of the via holes 181 (i.e., inside the via holes 181) has the uneven portion 102 having a height of about 10 μm to 50 μm. The textured surface of the substrate 110 in non-formation portions of the via holes 181 (i.e., outside the via holes 181) has the uneven portion 101 having a height of about 5 μm to 10 μm.

As above, because the surface of the substrate 110 in the formation portions of the via holes 181 is textured, the surface state of the substrate 110 inside the via holes 181 is good or improved. For example, if the via holes 181 are formed using a laser, the substrate 110 in the formation portions of the via holes 181 may be damaged because of an impact or a heat resulting from laser beam irradiation, etc. However, in the embodiment, because the surface of the substrate 110 in the formation portions of the via holes 181 is textured, a damaged portion of the substrate 110 resulting from the impact or the heat may be removed or reduced together when the uneven portions 101 and 102 are formed on the surface of the substrate 110 by removing a portion of the surface of the substrate 110 (refer to FIGS. 2A and 2B). Thus, the substrate 110 inside the via holes 181 has the textured surface from which the damaged portion is removed or reduced.

The emitter layer 120 is an impurity portion of a second conductive type (for example, an n-type) opposite the first conductive type of the substrate 110. The emitter layer 120 and the substrate 110 form a p-n junction. A plurality of electron-hole pairs produced by light incident on the substrate 110 is separated into electrons and holes by a built-in potential difference resulting from the p-n junction. Then, the separated electrons move to the n-type semiconductor, and the separated holes move to the p-type semiconductor. Thus, when the substrate 110 is of the p-type and the emitter layer 120 is of the n-type, the separated holes and the separated electrons move to the substrate 110 and the emitter layer 120, respectively. Accordingly, the holes in the substrate 110 become major carriers, and the electrons in the emitter layer 120 become major carriers.

Because the substrate 110 and the emitter layer 120 form the p-n junction, the emitter layer 120 may be of the p-type when the substrate 110 is of the n-type, unlike the embodiment described above. In this case, the separated electrons and the separated holes move to the substrate 110 and the emitter layer 120, respectively. When the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 formed of silicon nitride (SiNx) and/or silicon oxide ($SiO_x$) is positioned on the emitter layer 120 formed on the front surface of the substrate 110. The anti-reflection layer 130 reduces a reflectance of light incident on the substrate 110 to thereby increase the efficiency of the solar cell 1. The anti-reflection layer 130 may have a thickness of about 70 nm to 80 nm. The anti-reflection layer 130 may be omitted, if desired.

The emitter layer 120 has a plurality of expositing portions 182 exposing portions of the rear surface of the substrate 110. The expositing portions 182 block an electrical connection between the emitter layer 120 and the front electrode 150, that move and collect the electrons, and the rear electrode 160 that collects the holes, and thus the electrons and the holes can move smoothly. Although it is not shown in FIG. 1, the anti-reflection layer 130 and the emitter layer 120 underlying the anti-reflection layer 130 each have a plurality of exposing portions to expose portions of the front surface of the substrate 110, so as to implement an edge isolation of the substrate 110.

The plurality of front electrodes 150 are formed of at least one conductive material. For example, the front electrodes 150 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used. The front electrodes 150 extend substantially parallel to one another in a fixed direction on the front surface of the substrate 110. Each of the front electrodes 150 is electrically connected to the emitter layer 120 and covers at least one via hole 181. The front electrodes 150 collect carriers (e.g., electrons) moving to the emitter layer 120.

The at least one current collector 140 on the rear surface of the substrate 110 is mainly formed around the via hole 181 and in at least a portion of the via hole 181. The at least one current collector 140 is electrically connected to the front electrodes 150 through the via holes 181. The at least one current collector 140 is referred to as a bus bar and is formed of at least one conductive material. For example, the at least one current collector 140 may be formed of at least one selected from the group consisting of Ni, Cu, Ag, Al, Sn, Zn, In, Ti, Au, and a combination thereof. Other conductive materials may be used. In the embodiment, the at least one current collector 140 contains the same material as the front electrodes 150.

The at least one current collector 140 extends substantially parallel to one another in a direction crossing the front electrodes 150 on the front surface of the substrate 110. Thus, the plurality of via holes 181 are formed at each of crossings of the front electrodes 150 and the at least one current collector 140. The at least one current collector 140 transfers carriers (e.g., electrons) collected by the front electrodes 150 electrically connected to the current collector 140 to en external device.

In the embodiment, because the current collector 140 electrically connected to the front electrodes 150 is formed on the rear surface corresponding to the non-incident surface of the substrate 110, a light incident area of the solar cell 1 increases.

The rear electrode 160 is formed of at least one conductive material. For example, the rear electrode 160 may be formed of at least one selected from the group consisting of Ni, Cu, Ag, Al, Sn, Zn, In, Ti, Au, and a combination thereof. Other conductive materials may be used. The rear electrode 160 is spaced apart from the current collector 140. The rear electrode 160 is electrically connected to the substrate 110 and collects carriers (e.g., holes) moving to the substrate 110 to output the carriers to an external device.

In an alternative embodiment, the solar cell 1 may further include another current collector that is electrically connected to a portion of the rear electrode 160 and is formed of a conductive material with good conductivity, such as Ag. The current collector may improve a contact strength between the rear electrode 160 and an external device.

The BSF layer 170 between the rear electrode 160 and the substrate 110 is a region (e.g., a p+-type region) that is more heavily doped with impurities of the same conductive type as the substrate 110 than the substrate 110. The movement of electrons to the rear surface of the substrate 110 is prevented or reduced by a potential barrier resulting from a difference between impurity doping concentrations of the substrate 110 and the BSF layer 170. Thus, the BSF layer 170 prevents or reduces a recombination and/or a disappearance of the electrons and the holes around the surface of the substrate 110.

The solar cell 1 according to the embodiment of the invention having the above-described structure is a solar cell in which the at least one current collector 140 electrically connected to the front electrodes 150 is positioned on the rear surface of the substrate 110 on which light is not incident. An operation of the solar cell 1 will be described below.

When light irradiated to the solar cell 1 is incident on the substrate 110 through the anti-reflection layer 130 and the emitter layer 120, a plurality of electron-hole pairs are generated in the substrate 110 by light energy based on the incident light. Because the surface of the substrate 110 is the textured surface having the plurality of uneven portions 101, a light reflectance in the entire surface of the substrate 110 is reduced. Further, because both a light incident operation and a light reflection operation are performed on the textured surface, a light absorption increases and the efficiency of the solar cell 1 is improved. In addition, because a reflection loss of light incident on the substrate 110 is reduced by the anti-reflection layer 130, an amount of light incident on the substrate 110 further increases.

The electron-hole pairs are separated by the p-n junction of the substrate 110 and the emitter layer 120, and the separated electrons move to the n-type emitter layer 120 and the separated holes move to the p-type substrate 110. Then, the electrons moving to the n-type emitter layer 120 are collected by the front electrodes 150 and then move to the current collector 140 electrically connected to the front electrodes 150 through the via holes 181. The holes moving to the p-type substrate 110 are collected by the rear electrode 160 through the BSF layer 170 and then move along the rear electrode 160. When the current collector 140 is connected to the rear electrode 160 using electric wires, current flows therein to thereby enable use of the current for electric power.

In the embodiment of the invention, the surface of the substrate 110 inside the via holes 181 is textured to have the plurality of uneven portions 102. Thus, a cross-sectional area of the substrate 110 inside the via holes 181 increases to thereby increase a contact area between the emitter layer 120 and the current collector 140 inside the via holes 181. Further, a contact resistance is reduced because of an increase in the contact area, and thus the conductivity of the current collector 140 increases. Hence, the transfer efficiency of the carriers transferred to the front electrodes 150 is improved.

Further, because the surface of the substrate 110 inside the via holes 181 is textured, the damaged portion of the substrate 110 resulting from the impact or the heat generated when the via holes 181 are formed is removed or reduced. Thus, a contact strength between the current collector 140 and the emitter layer 120 inside the via holes 181 is improved. In addition, the conductivity of the carriers transferred through the emitter layer 120 is further improved, and the transfer efficiency of the carriers is further improved.

Furthermore, because the height of the uneven portion 102 formed inside the via holes 181 is greater than the height of the uneven portion 101 formed outside the via holes 181, the cross-sectional area of the substrate 110 inside the via holes 181 increases to thereby reduce the contact resistance.

When the current collector 140 is connected to the rear electrode 160 using electric wires, current flows therein to thereby enable use of the current for electric power.

A method of manufacturing the solar cell 1 according to the embodiment of the invention is described below with reference to FIGS. 3A to 3H.

FIGS. 3A to 3H are cross-sectional views sequentially illustrating each of stages in a method of manufacturing a solar cell according to an embodiment of the invention.

Figure 3A:
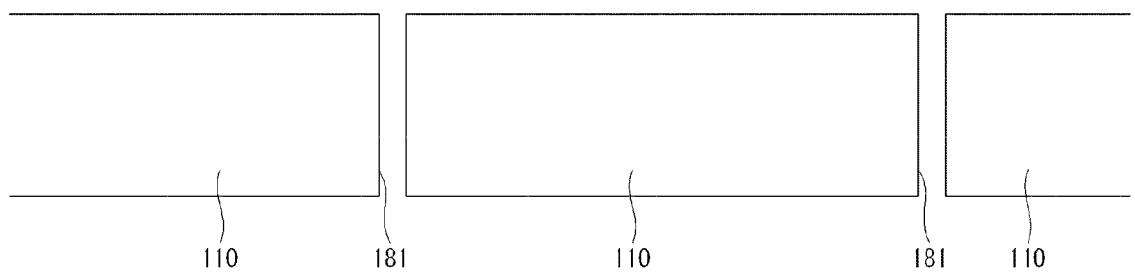
FIGS. 3A to 3H are cross-sectional views sequentially illustrating each of stages in a method of manufacturing a solar cell according to an embodiment of the invention.

As shown in FIG. 3A, the plurality of via holes 181 are formed on the substrate 110 formed of p-type single crystal silicon or p-type polycrystalline silicon. The via holes 181 are formed through a laser drilling method using a laser beam. Other methods may be used.

Figure 3B:
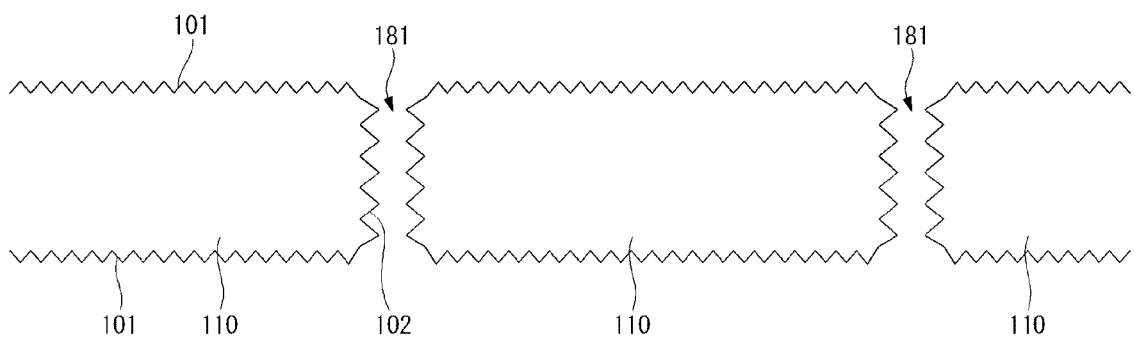

As shown in FIG. 3B, a texturing process is performed on the entire surface of the substrate 110 to form a textured surface of the substrate 110 having the plurality of uneven portions 101 and 102. When the substrate 110 is formed of p-type single crystal silicon, the texturing process is performed using a basic solution such as KOH, NaOH, and tetramethylammonium hydroxide (TMAH). When the substrate 110 is formed of p-type polycrystalline silicon, the texturing process is performed using an acid solution such as HF and $HNO_3$.

In the embodiment of the invention, when the texturing process is performed on the entire surface of the substrate 110, an ultrasonic wave having a fixed frequency is applied to an etchant used in the texturing process to generate an ultrasonic vibration in the etchant. Hence, the etchant easily penetrates into the inside of the via holes 181.

In the related art, because via holes have the small size of about 30 μm to 100 μm, it is difficult to penetrate the etchant into the inside of the via holes. Even if the etchant penetrates into the inside of the via holes, the etchant penetrates not uniformly but non-uniformly into the entire surface of each via hole. Thus, the surface of a substrate inside the via holes need not be etched or may be partially etched. Further, a damaged portion resulting from a vibration, a heat, etc. generated when the via holes are formed is not removed and remains. The damaged portion adversely affects an operation efficiency of a current collector.

However, in the embodiment of the invention, because the etchant easily penetrates into the inside of the via holes 181 by the ultrasonic vibration, etching is uniformly performed inside each via hole 181 as well as the front and rear surfaces of the substrate 110. Hence, the front and rear surfaces of the substrate 110 and the surface of the substrate 110 inside each via hole 181 are etched to form the plurality of uneven portions 101 and 102. In this case, the damaged portion of the substrate 110 is removed or reduced by etching the substrate 110 inside the via holes 181, and the cross-sectional area of the substrate 110 inside the via holes 181 increases by the uneven portions 102 inside the via holes 181. In addition, because the damaged portion is generated inside the via holes 181 by the laser beam irradiation, the height of the uneven portions 102 in the formation portions of the via holes 181 is greater than the height of the uneven portions 101 in the non-formation portions of the via holes 181, so that the etchant penetrates more easily into the damaged portion than a non-damaged portion. In the embodiment of the invention, the height of the uneven portion 101 may be approximately 5 μm to 10 μm, and the height of the uneven portion 102 may be approximately 10 μm to 50 μm.

Figure 3C:
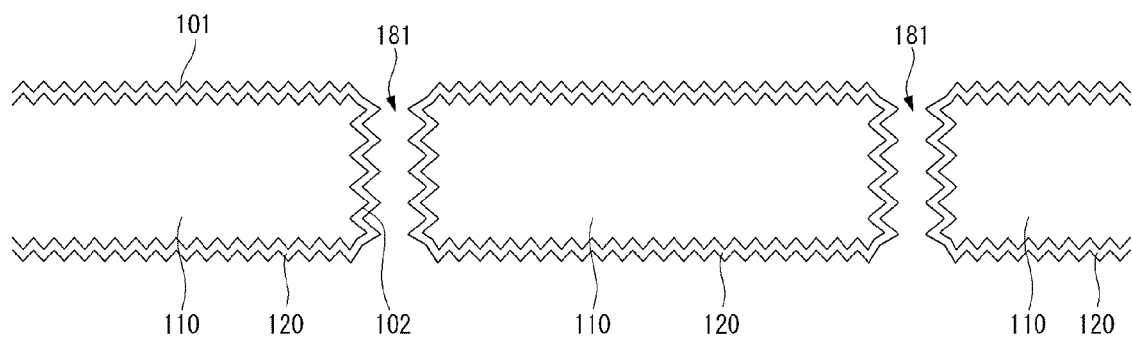

As shown in FIG. 3C, a high temperature thermal process of a material (for example, $POCl_3$ or $H_3PO_4$) containing impurities of a group V element such as P, As, and Sb is performed on the substrate 110 to distribute the group V element impurities on the substrate 110. Hence, the emitter layer 120 is formed on the entire surface of the substrate 110 including the front and rear surfaces of the substrate 110 and an inner surface and a side surface of each of the via holes 181. Unlike the embodiment, if the substrate 110 is of an n-type, a high temperature thermal process of a material (for example, $B_2H_6$) containing group III element impurities may be performed on the substrate 110 or the material containing the group III element impurities may be stacked on the substrate 110 to form the p-type emitter layer 120 on the entire surface of the substrate 110. Then, phosphorous silicate glass (PSG) containing phosphor (P) or boron silicate glass (BSG) containing boron (B) produced when p-type impurities or n-type impurities are distributed inside the substrate 110 are removed through an etching process.

Figure 3D:
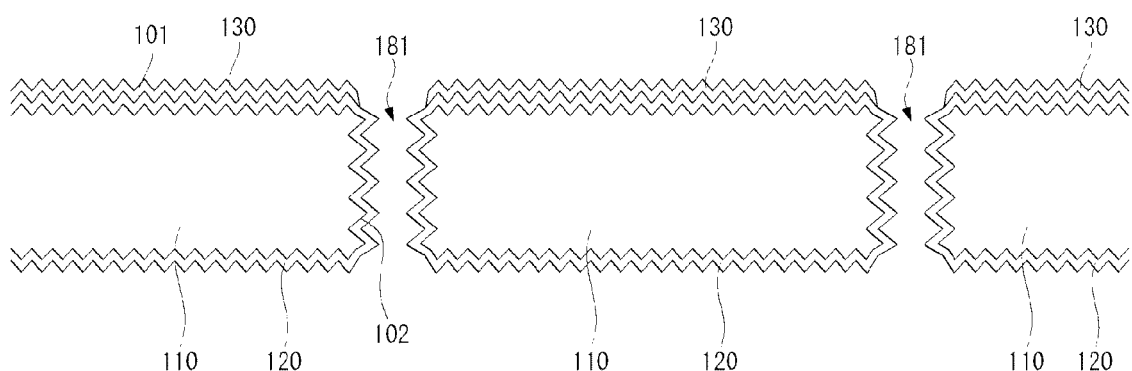

As shown in FIG. 3D, the anti-reflection layer 130 is formed on the front surface of the substrate 110 using a chemical vapor deposition (CVD) method, such as a plasma enhanced chemical vapor deposition (PECVD) method. In addition, the anti-reflection layer 130 may be formed inside the via holes 181 or a portion thereof.

Figure 3E:
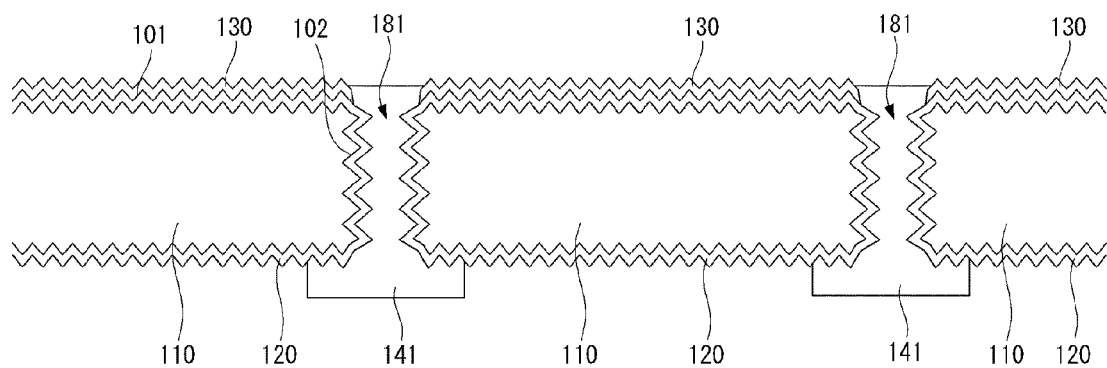

As shown in FIG. 3E, a current collector paste 141 containing Ag is coated on a predetermined portion of the emitter layer 120 using a screen printing method and then is dried at about 170° C. The current collector paste 141 is filled in an inner space of the via hole 181. The current collector paste 141 may contain at least one selected from the group consisting of Ni, Cu, Al, Sn, Zn, In, Ti, Au, and a combination thereof, instead of Ag. Other materials may be used.

Figure 3F:
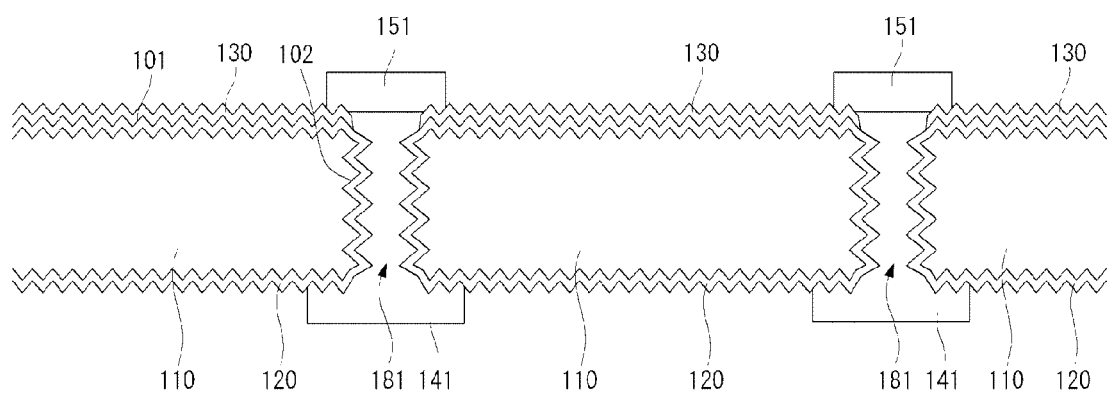

As shown in FIG. 3F, a front electrode paste 151 containing Ag is coated on a corresponding portion of the front surface of the substrate 110 using the screen printing method, so that the front electrode paste 151 contacts the current collector paste 141 filled in the via hole 181 and extends straight in a fixed direction. Then, the front electrode paste 151 is dried at about 170° C. Alternatively, the front electrode paste 151 may contain at least one selected from the group consisting of Ni, Cu, Al, Sn, Zn, In, Ti, Au, and a combination thereof, instead of Ag. Other materials may be used.

Figure 3G:
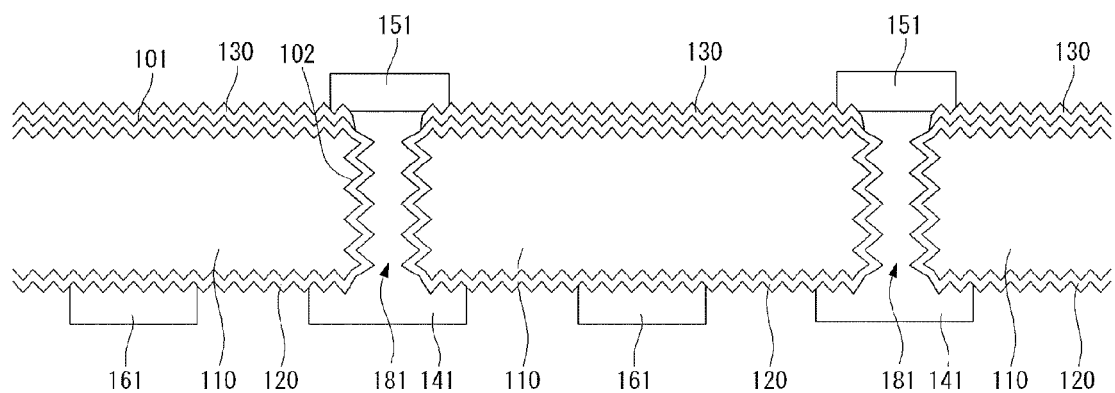

As shown in FIG. 3G, a rear electrode paste 161 is coated on a corresponding portion of the rear surface of the substrate 110, so that the rear electrode paste 161 is spaced apart from the current collector paste 141. Then, the rear electrode paste 161 is dried at about 170° C. The rear electrode paste 161 contains Al and may contain at least one selected from the group consisting of Ag, Ni, Cu, Sn, Zn, In, Ti, Au, and a combination thereof. Other materials may be used.

Figure 3H:
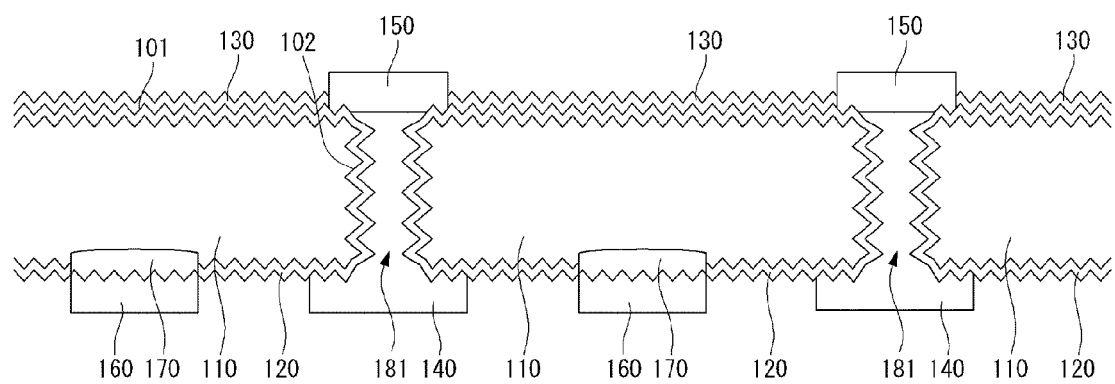

As shown in FIG. 3H, the substrate 110 is fired at a temperature of about 750° C. to 800° C. to form the plurality of front electrodes 150, the at least one current collector 140 electrically connected to the front electrodes 150, the rear electrode 160, and the BSF layer 170.

In an alternative embodiment, the at least one current collector 140, the front electrodes 150, and the rear electrode 160 may be formed in desired portions using the CVD method instead of the screen printing method. In this case, a drying process and a firing process may be omitted.

Next, the plurality of exposing portions 182 (refer to FIG. 1) are formed on portions of the emitter layer 120 on the rear surface of the substrate 110 and on the substrate 110 underlying the portions of the emitter layer 120 to complete the solar cell 1 shown in FIG. 1. The exposing portions 182 are formed between the rear electrode 160 and the current collector 140 and thus electrically separate the rear electrode 160 from the front electrodes 150. When the plurality of exposing portions 182 are formed, an exposing portion is formed in a portion of the emitter layer 120 formed at an edge of the substrate 110 to implement an edge isolation of the substrate 110. In addition, the plurality of exposing portions 182 and the exposing portion used in the edge isolation may be formed using the PECVD method instead of the laser.

A solar cell according to another embodiment of the invention is described below with reference to FIGS. 4 to 6.

Figure 4:
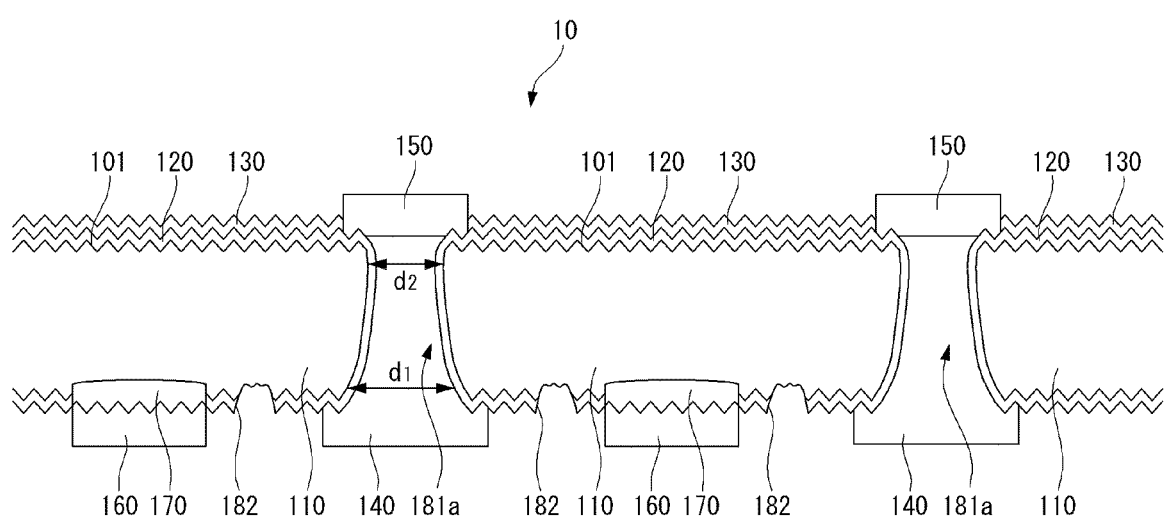
FIG. 4 is a partial cross-sectional view of a solar cell according to another embodiment of the invention.

FIG. 4 is a partial cross-sectional view of a solar cell according to another embodiment of the invention. FIG. 5 is a cross-sectional view of a via hole. FIG. 6 is a partial cross-sectional view of a solar cell according to another embodiment of the invention. In the following explanations, structural elements having the same functions and structures as those illustrated in FIG. 1 are designated by the same reference numerals, and a further description may be briefly made or may be entirely omitted.

As shown in FIG. 4, a solar cell 10 according to an embodiment of the invention, similar to the solar cell 1 shown in FIG. 1, includes a substrate 110 having a plurality of via holes 181a, an emitter layer 120 on the substrate 110, an anti-reflection layer 130 on the emitter layer 120, at least one current collector 140 that is formed on a rear surface of the substrate 110 and which is connected to the via holes 181a and the emitter layer 120 positioned around each of the via holes 181a, a plurality of front electrodes 150 that are formed on the emitter layer 120 formed on a front surface of the substrate 110 and are electrically connected to the at least one current collector 140 through the via holes 181a, a rear electrode 160 that is formed on the rear surface of the substrate 110 and is spaced apart from the at least one current collector 140, and a back surface field (BSF) layer 170 between the rear electrode 160 and the substrate 110 underlying the rear electrode 160.

On the other hand, unlike the solar cell 1 shown in FIG. 1, each of the via holes 181a of the solar cell 10 shown in FIG. 4 has a tapered shape. As the via hole 181a goes from the rear surface to the front surface of the substrate 110, it has a decreasing width. In the embodiment, a ratio of a maximum width d1 to a minimum width d2 of the via hole 181a is approximately 1:0.1 to 1:0.9. Preferably, the ratio of the maximum width d1 to the minimum width d2 of the via hole 181a is approximately 1:0.4 to 1:0.9. An inclined angle of the via hole 181a with respect to the front surface of the substrate 110 may be approximately 45° to 85°.

Further, unlike the solar cell 1 shown in FIG. 1, the surface of the substrate 110 inside each via hole 181a of the solar cell 10 is not textured.

Figure 5:
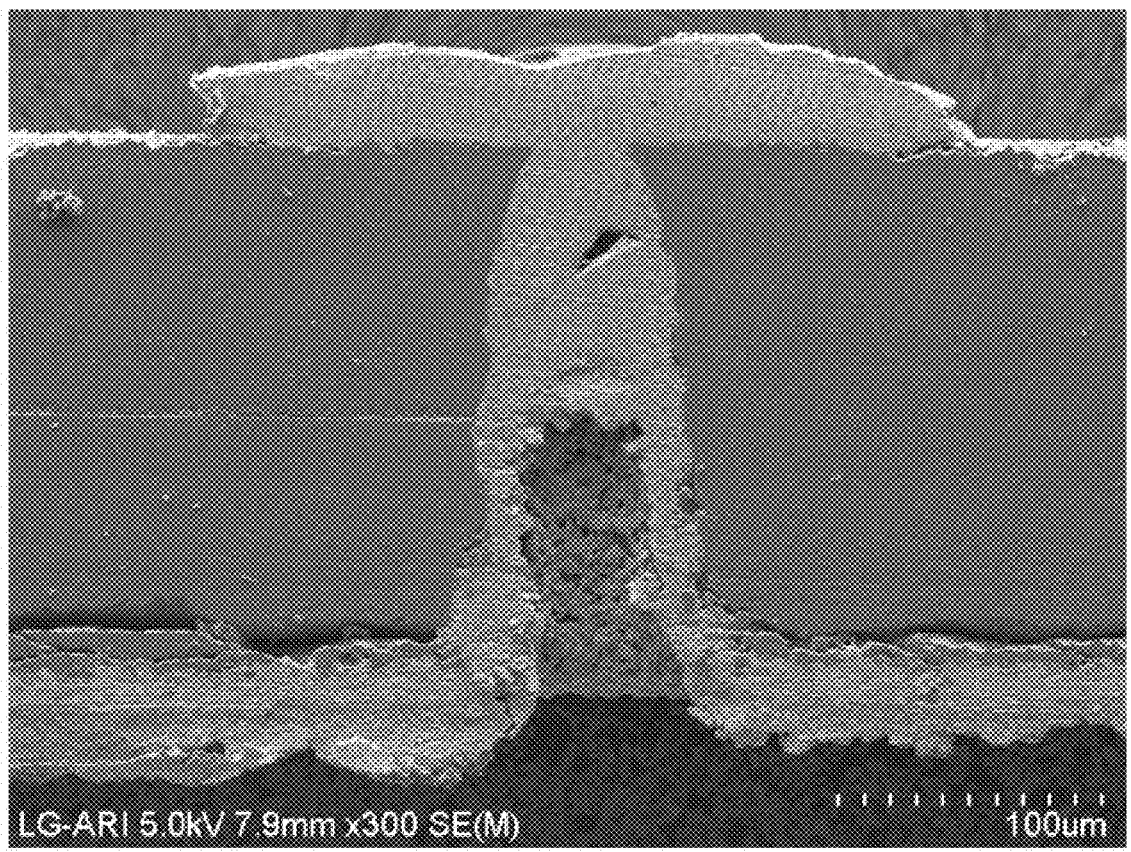
FIG. 5 is a cross-sectional view of a via hole.

As shown in FIG. 5, when each of the via holes 181a has the tapered shape, the width of the via hole 181a is not constant and varies depending on a location of the via hole 181a. Because the via hole 181a has a gradually decreasing width as the via hole 181a goes from the rear surface to the front surface of the substrate 110, a light receiving area of the solar cell 10 increases and a carrier transfer efficiency of the front electrodes 150 is improved. In other words, because the via hole 181a has the gradually decreasing width (or a gradually decreasing diameter) as the via hole 181a goes from the rear surface to the front surface corresponding to a light incident surface of the substrate 110, the size of the via hole 181a decreases. Thus, a reduction in the light receiving area resulting from the via hole 181a decreases. Further, because the width of the via hole 181a formed inside the front electrode 150 decreases, a damage rate of the front electrode 150 resulting from the via hole 181a decreases, and also the carrier transfer efficiency of the front electrode 150 is improved.

When the current collector 140 is formed on the rear surface of the substrate 110, it is easy to form the current collector 140 inside the via hole 181a because the width of the via hole 181a gradually decreases from the rear surface of the substrate 110. In particular, when a paste for current collector is printed using a screen printing method to form the current collector 140, the via hole 181a is easily filled with the current collector paste because of the tapered shape of the via hole 181a. Hence, connection efficiency between the front electrode 150 and the current collector 140 is improved.

Since a method of manufacturing the solar cell 10 is substantially the same as the method of manufacturing the solar cell 1, except that a process for forming the plurality of via holes 181a and a process for texturing the surface of the substrate 110, a further description may be briefly made or may be entirely omitted. More specifically, the solar cell 10 is manufactured according to the processes illustrated in FIGS. 3C to 3H, except the processes illustrated in FIGS. 3A and 3B.

In a process (corresponding to the process illustrated in FIG. 3A) for irradiating a laser beam to the substrate 110 to form the plurality of via holes 181a, an energy level of the laser beam varies over time. For example, as time passes, the energy level of the laser beam irradiated to the substrate 110 gradually decreases.

The via hole 181a is formed in the form of tapered shape by varying the number of irradiations, irradiation time, or energy level of the laser beam irradiated to the substrate 110 depending on kinds of the substrate 110, the size of the via hole 181a, etc. Further, in the embodiment, the energy level (i.e., an intensity) of the laser beam decreases as the number of irradiations or irradiation time of the laser beam increases. In the embodiment, if the via hole 181a is formed using a laser beam having a wavelength of about 355 nm, the energy level of the laser beam may be approximately 1 W to 5 W. If the via hole 181a is formed using a laser beam having a wavelength of about 532 nm, the energy level of the laser beam may be approximately 5 W to 10 W. Further, if the via hole 181a is formed using a laser beam having a wavelength of about 1,064 nm, the energy level of the laser beam may be approximately 10 W to 20 W.

Alternatively, the via hole 181a may be formed in the form of tapered shape by varying a focus position of the laser beam irradiated to the substrate 110 depending on irradiation time, the number of irradiations, etc.

Further, unlike the process illustrated in FIG. 3B, the ultrasonic vibration for texturing the surface of the substrate 110 inside the tapered-shaped via hole 181a is not used in the solar cell 10.

Figure 6:
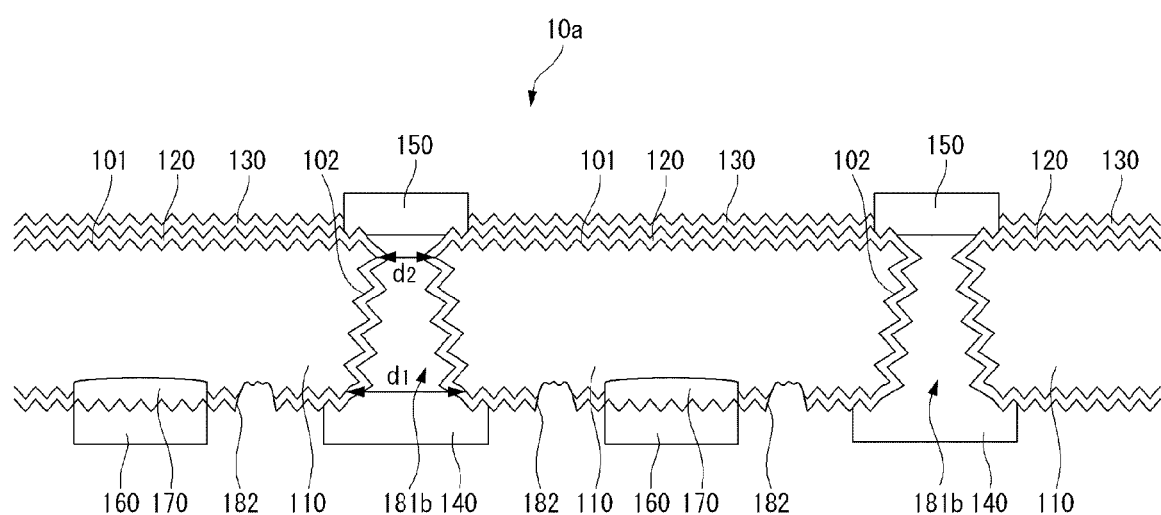
FIG. 6 is a partial cross-sectional view of a solar cell according to another embodiment of the invention.

Further, as shown in FIG. 6, a solar cell 10a according to an embodiment of the invention includes a plurality of tapered-shaped via holes 181b similar to the solar cell 10 shown in FIG. 4. In the solar cell 10a shown in FIG. 6, when the surface of a substrate 110 is textured in the same manner as the solar cell 1 shown in FIG. 1, the surface of the substrate 110 inside each of the via holes 181b is textured using an ultrasonic vibration. As a result, a plurality of uneven portions 101 and 102 are formed inside the via holes 181b as well as in a portion where the via holes 181b are not formed.

Since a method of manufacturing the solar cell 10a is substantially the same as the methods of manufacturing the solar cells 1 and 10 described with reference to FIGS. 3A to 3H and FIG. 4, a further description may be briefly made or may be entirely omitted.

Further, since the solar cell 10a shown in FIG. 6 has all of the advantages of the solar cells 1 and 10 shown in FIGS. 1 and 4, the efficiency of the solar cell 10a shown in FIG. 6 is further improved compared with the solar cells 1 and 10 shown in FIGS. 1 and 4.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
    a substrate of a first conductive type having at least one via hole, the at least one via hole having a textured surface having a plurality of uneven portions;
    an emitter layer of a second conductive type opposite the first conductive type formed in the substrate;
    at least one first electrode formed on the emitter layer positioned on a first surface of the substrate;
    at least one current collector positioned on a second surface of the substrate, which is opposite the first surface and electrically connected to the at least one first electrode through the at least one via hole; and
    a second electrode positioned on the second surface of the substrate to be spaced apart from the at least one current collector and electrically connected to the substrate,
    wherein the substrate further comprises a plurality of uneven portions formed on at least one of the first surface and the second surface of the substrate,
    a height of each of the plurality of uneven portions formed in the at least one via hole is greater than a height of each of the plurality of uneven portions formed on the at least one of the first surface and the second surface of the substrate, and
    each of the plurality of uneven portions has a pyramid shape and the height of each uneven portion formed at the at least one via hole is approximately 10 μm to 50 μm, and the height of each of the plurality of uneven portions formed on the at least one of the first surface and the second surface of the substrate is 5 μm to 10 μm.

2. The solar cell of claim 1, wherein a diameter of the at least one via hole formed at the first surface of the substrate is smaller than a diameter of the at least one via hole formed at the second surface of the substrate.

3. The solar cell of claim 1, wherein the at least one via hole has an increasing diameter as it goes from the first surface of the substrate to the second surface of the substrate.

4. The solar cell of claim 2, wherein a ratio of a maximum width to a minimum width of the at least one via hole is approximately 1:0.1 to 1:0.9.

5. The solar cell of claim 1, further comprising an anti-reflection layer formed on the emitter layer that is formed on the first surface of the substrate.

6. The solar cell of claim 1, further comprising a back surface field layer of the first conductive type formed between the second electrode and the substrate, the back surface field layer having an impurity doping concentration greater than an impurity doping concentration of the substrate.

7. The solar cell of claim 1, wherein the substrate is formed of single crystal silicon or polycrystalline silicon.

8. The solar cell of claim 1, wherein the textured surface is an etched surface.

9. The solar cell of claim 8, wherein the etched surface is a wet etched surface.

* * * * *